United States Patent
Bernhardt et al.

[11] Patent Number: 5,933,712
[45] Date of Patent: Aug. 3, 1999

[54] ATTACHMENT METHOD FOR STACKED INTEGRATED CIRCUIT (IC) CHIPS

[75] Inventors: Anthony F. Bernhardt, Berkeley; Vincent Malba, Livermore, both of Calif.

[73] Assignee: The Regents of the University of California, Oakland, Calif.

[21] Appl. No.: 09/045,626

[22] Filed: Mar. 19, 1998

Related U.S. Application Data

[60] Provisional application No. 60/041,262, Mar. 19, 1997.

[51] Int. Cl.[6] .......................... H01L 21/44; H01L 21/48; H01L 21/50
[52] U.S. Cl. ...................... 438/125; 438/106; 438/107; 438/109
[58] Field of Search ................................. 438/125, 106, 438/107, 109

[56] References Cited

U.S. PATENT DOCUMENTS

| | | |
|---|---|---|
| 5,432,729 | 7/1995 | Carson et al. . |
| 5,466,634 | 11/1995 | Beilstein, Jr. et al. . |
| 5,578,516 | 11/1996 | Chou . |

OTHER PUBLICATIONS

UCRL–JC–125631, V. Malba et al., "Fabrication of a DRAM Cube Using a Novel Laser Patterned 3–D Interconnect Process," 6th International Conference On Multichip Modules, Apr. 2–4, 1997, Denver, Colorado.

*Primary Examiner*—Kevin M. Picardat
*Assistant Examiner*—Deven Collins
*Attorney, Agent, or Firm*—L. E. Carnahan

[57] ABSTRACT

An attachment method for stacked integrated circuit (IC) chips. The method involves connecting stacked chips, such as DRAM memory chips, to each other and/or to a circuit board. Pads on the individual chips are rerouted to form pads on the side of the chip, after which the chips are stacked on top of each other whereby desired interconnections to other chips or a circuit board can be accomplished via the side-located pads. The pads on the side of a chip are connected to metal lines on a flexible plastic tape (flex) by anisotropically conductive adhesive (ACA). Metal lines on the flex are likewise connected to other pads on chips and/or to pads on a circuit board. In the case of a stack of DRAM chips, pads to corresponding address lines on the various chips may be connected to the same metal line on the flex to form an address bus. This method has the advantage of reducing the number of connections required to be made to the circuit board due to bussing; the flex can accommodate dimensional variation in the alignment of chips in the stack; bonding of the ACA is accomplished at low temperature and is otherwise simpler and less expensive than solder bonding; chips can be bonded to the ACA all at once if the sides of the chips are substantially coplanar, as in the case for stacks of identical chips, such as DRAM.

22 Claims, 4 Drawing Sheets

ATTACHMENT METHOD FOR STACKED INTEGRATED CIRCUIT (IC) CHIPS

RELATED APPLICATION

This application relates to U.S. Provisional Application Ser. No. 60/041,262 filed Mar. 19, 1997, and claims priority thereof.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to stacking integrated circuit (IC) chips, particularly to stacking IC chips having surface pads rerouted to form pads on the side of the chips, and more particularly to attaching the side pads of such stacked chips to one another and/or to a circuit board via metal lines on a flexible plastic tape by an anisotropically conducting adhesive.

Packaging integrated circuits in three dimensions (3-D) remains an important area of endeavor in the multichip module community. Many technologies have been proposed and demonstrated in the past decade. Impressive solid-state recorders featuring 3-D stacks as integrated memory components in a high performance multichip module system have been demonstrated, and very high density 3-D stacks (>40 chips/6 mm thick stack) have been produced.

A major drawback of a full implementation of any of the various 3-D technologies has been the cost of the packaging. The need for simpler, lower cost options to current technologies is the driving force behind the research and development in the high density IC packaging arena.

Among the various efforts to simplify packaging of stacked IC chips or via was the rerouting of the pads on the surface of the chips to form pads on the side of the chips, whereafter the chips can be stacked on top of each other, with needed interconnections being made readily accessible due to the rerouted pads on the chip sides. This pad rerouting approach is described and claimed in copending U.S. application Ser. No. 08/387,495 filed Feb. 13, 1995, entitled "3-D Laser Patterning Process," and Ser. No. 08/733,854 filed Oct. 18, 1996, entitled "L-Connect Routing of Die Surface Pads to the Die Edge for Stacking in a 3-D Array," each assigned to the assignee of the instant application. The stacked chips were connected to one another and to a circuit board by solder connections.

The present invention utilizes the pad rerouting approach of the above-referenced applications, whereby the chips can be stacked on top of each other after the pad reroute, and then connects the stacked chips to each other and/or to a circuit board using a flexible plastic tape having metal lines and an anisotropically conducting adhesive (ACA). The pads on the side of a chip are connected to metal lines on the flexible plastic tape (flex) by the ACA. Metal lines on the flex are likewise connected to pads of other chips in the stack and/or to the circuit board. The flex can accommodate dimensional variation in the alignment of chips in the stack; bonding of the ACA is accomplished at low temperature and is otherwise simpler and less expensive than solder bonding; and the chips can be bonded to the ACA all at once if the sides of the chips are substantially coplanar.

SUMMARY OF THE INVENTION

An object of the present invention is to provide an attachment method for stacked IC chips.

A further object of the invention is to provide a method for attaching stacked IC chips having side-located pads.

A further object of the invention is to provide a laser patterned process to reroute pads of IC chips to the side surfaces of the chips.

A further object of the invention is to provide a method of connecting stacked chips to each other and/or to a circuit board.

Another object of the invention is to provide an attachment method for stacked IC chips utilizing metal lines on a flexible plastic tape and an anisotropically conducting adhesive.

Another object of the invention is to provide a method for interconnecting pads on stacked IC chips which involves rerouting the pads to form pads on the side of the chips, stacking the chips, and connecting the pads of each chip to another chip and/or to a circuit board without solder bonding.

Another object of the invention is to provide stagger data and enable pads on various chips in the stack to permit connection by a single metal line to the board.

Another object of the invention is to provide a method for attaching pads of a stack of DRAM chips having corresponding address lines so as to form an address bus, thereby reducing the number of connections required to be made to a circuit board.

Another object of the invention involves attaching pads of stacked chips using metal lines on a flexible plastic tape by an ACA at a temperature substantially lower than solder bonding.

Another object of the invention is to provide an attachment method for stacked IC chips wherein the chips can be bonded all at once to a flexible tape using an ACA, and wherein the flexible tape accommodates dimension variation in the alignment of chips in a stack.

Other objects and advantages of the present invention will become apparent from the following description and accompanying drawings. Basically, the present invention involves an attachment method for stacked IC chips. The method of this invention utilizes rerouted chip pads which are formed on the side of the chip, stacking of the chips after pad reroute, and connecting the pads of each chip to pads on another chip and/or to a circuit board without solder bonding. The pads on the side of a chip are connected to metal lines on a flexible plastic tape by an ACA, and metal lines on the flexible tape are likewise connected to pads on other chips and/or to a circuit board. The flexible tape accommodates dimensional variation in the alignment of chips in the stack. Bonding of the ACA is accomplished at low temperatures and is otherwise simpler and less expensive than solder bonding. The chips can be bonded to the ACA all at once if the sides of the chips are substantially coplanar, as in the case for stacks of identical chips such as DRAM chips. The invention is particularly applicable to the attachment of stacked DRAM memory chips having pads to corresponding address lines on the various chips, wherein these pads are connected to the same metal line of the flexible tape to form and address bus, thereby adding the advantage of reducing the number of connections required to be made to the circuit board due to bussing. The method of this invention has applications in high density memory systems; e.g., supercomputers and hand-held electronics, such as personal digital assistants and cellular phones, as well as for other solid-state memory systems, such as used in telemetry packages.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The present invention is directed to an attachment method for stacked IC chips. The present invention is particularly applicable in the 3-D packaging of integrated circuits utilized, for example, as integrated memory components in a high performance multichip module system. The invention is particularly applicable in the dynamic random access memory (DRAM) stack fabrication and attachment process, as well as for high density 3-D packaging for electronics Basically, the method involves rerouting of the input/output (I/O) pads of IC chips or die to form new pads on one of the long sidewalls of the bares chip or die. The chips or die are stacked and bonded using a flexible tape and anisotropically conducting adhesive (ACA) and pads are arranged so that, in the case of DRAM chips, data lines and some control lines in a stack are staggered while address, power, ground, and some control lines are positioned identically. This architecture permits bonding of the stack to a single-sided flexible tape using ACA. The flexible tape is bonded to a circuit board using ACA to complete the assembly.

The rerouting of the pads may be carried out by either process of the above-referenced copending applications, or by a laser patterned process which uses a laser to expose an electrophoretic photoresist which is conformally plated onto a thin metal seed layer that covers the various surfaces. After resist exposure and development, copper, nickel, or gold is plated onto the seed layer through the resist mark. Finally, the residual resist and seed layer are removed, leaving conformally plated metal traces. The laser lithography reroute process is described in greater detail hereinafter.

Figure 1:
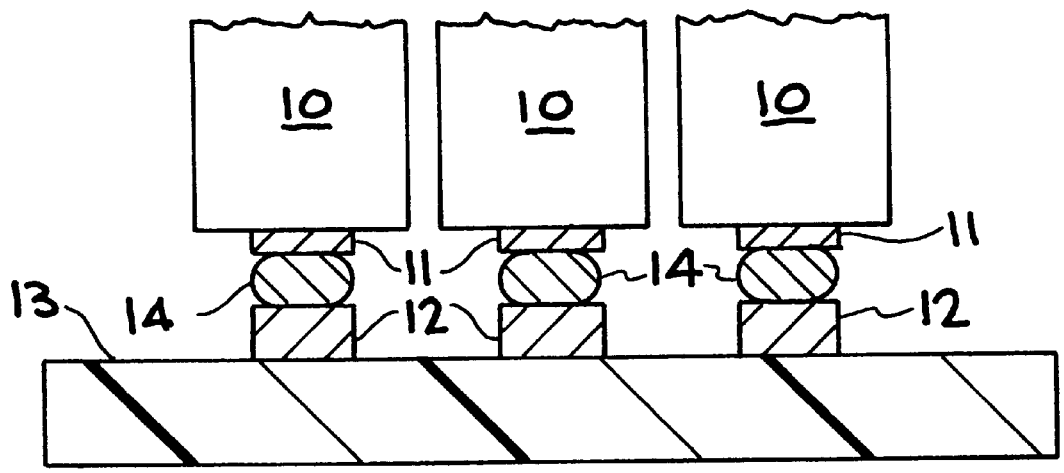
FIG. 1 illustrates the conventional method for attaching side-located chip pads to a substrate.

While the above-referenced copending applications teach how pads on an integrated circuit (IC) chip can be rerouted to pads on the side of the chip, and that the stacked chips after rerouting of the pads were interconnected to pads of other chips in the stack or to a circuit board, the interconnections were generally made by solder bonds, as illustrated in FIG. 1. As shown, a plurality of chips 10 having side-located (rerouted) pads 11 were bonded to pads 12 of a substrate or circuit board 13 by a solder connection or bond 14, which has a 300° C. reflow temperature, thus submitting the chips and substrate to temperatures whereby low-temperature type (plastic) substrates can not be used. Another disadvantage of the solder bonding is that it is difficult to accommodate mechanical stresses generated by the differences in thermal expansion coefficient between the substrate and the chip stack (cube). Also, in the case of memory chips, far more pads are required on the substrate than are required by the interconnect method of the present invention, as described hereinafter with respect to FIGS. 2 and 3.

Figure 2:
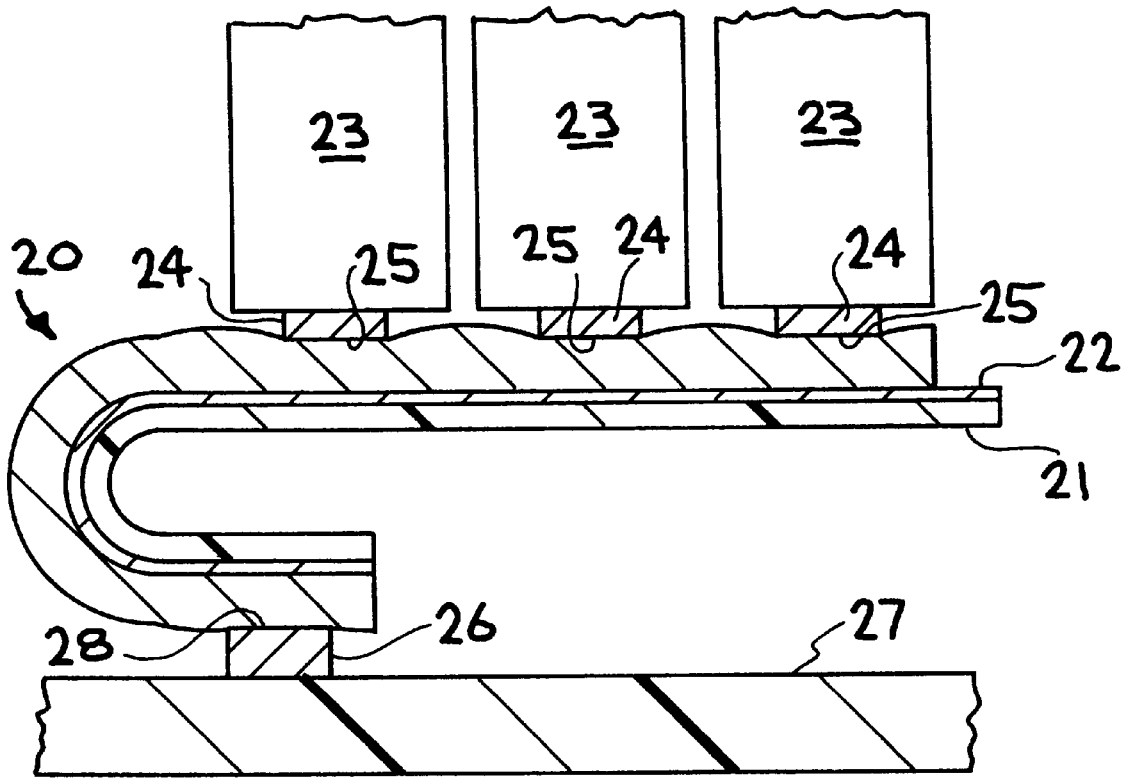
FIG. 2 illustrates an embodiment produced by the method of the present invention of attaching side-located chip pads to a substrate.
Figure 3:
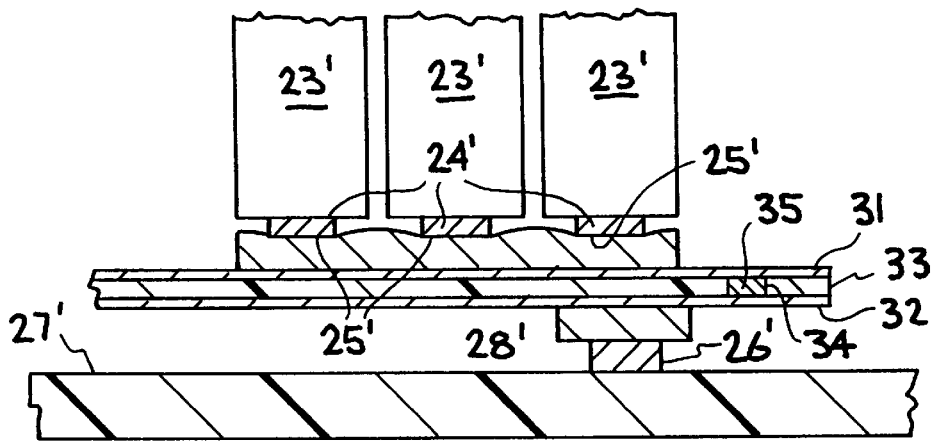
FIG. 3 illustrates another embodiment produced by the method of the invention of attaching side-located chip pads to a substrate.

As seen from FIGS. 2 and 3, the basic principle of the present invention is to attach a flex cable or a flexible plastic tape having one or more metal lines thereon to the side-located (rerouted) pads of the chips of a stack (cube) using an ACA, and then connect the end of flex cable or flexible plastic tape to a pad on the circuit board, preferably also using ACA. ACA is commercially available and is exemplified by "ZAF," made by 3M. The metal line or lines on the flex tape may be, for example, Cu, Ni, or Au. ACA is easier and cheaper to use than solder, with a typical cure temperature of 150° C. compared to the 300° C. solder reflow temperature, and there is none of the pad preparation, solder dissolution of pad metal, solder contact, embrittlement, and other problems associated with solder bonding. Also, unlike solder bonding, ACA does not have to be patterned, and ACA between adjacent pads does not cause a short circuit like a solder bond. The flex cable or flexible plastic tape having metal lines thereon is commercially available, and is exemplified by Dynaflex manufactured by Sheldahl; and acts to relieve any stress due to bonding with the ACA since it is thin and flexible. For example, the tape has a thickness of 10 $\mu$m to 75 $\mu$m, and the ACA provides a sufficient bond with a thickness of 10 $\mu$m to 50 $\mu$m.

FIGS. 2 and 3 also illustrate bonding a memory chip stack or cube wherein the flex cable acts as a "bus" for addresses and control lines on the chips (i.e., I/O pads), which are bussed or connected to the same conductor on the flex cable and only one connection is made from the flex cable to the circuit board or substrate for each bussed line instead of one per chip, thus simplifying the fabrication of the circuit board or substrate.

Referring now to FIG. 2, a flex cable or flexible plastic tape generally indicated at 20 having an insulator (plastic) layer 21 and at least one metal line or layer 22 thereon is connected to a plurality of chips 23 having rerouted or side-located pads 24 by bonds 25 to an ACA layer. The flexible tape 20 is bent at a 180° angle to enable the metal line 21 to be connected to a pad 26 on a substrate 27 via an ACA bond 28. Thus, by the metal line 21 of flexible tape 20, each of chips 23 are connected to a single pad 26 on substrate 27, for reasons discussed above.

The FIG. 3 embodiment is similar to FIG. 2 except it uses a flexible plastic tape having two metal lines or layers connected via an opening in the plastic or insulation layer, and thus similar components will be given similar reference numbers. As shown, a flexible plastic tape or flex cable 30 composed of metal lines or layers 31 and 32 separated by an insulator (plastic) layer 33 having at least one opening 34 therein, whereby metal layers 31 and 32 are connected by a metal plug 35. Note that the metal line or layer 32 need not extend the full length of the insulator layer 33. Metal line or layer 31 is secured to pads 24' of chips 23' by ACA bonds 25', as in the FIG. 2 embodiment, while metal line or layer 32 is secured to a pad 26' of a substrate 27' by an ACA bond 28'. One advantage of the FIG. 3 embodiment is the elimination of the bend in the flexible plastic tape. Also, the metal lines 31 and 32 may be constructed to form a structure that is compliant under thermal stresses and designed to accommodate mechanical expansion and contraction. In essence, the problems of mechanical and electrical attachment are separated by the method of the present invention.

Attachment of the flexible plastic tape or flex cable (20 or 30) to the pads (24 or 24') of the stack of chips (23 or 23') of FIGS. 2 and 3 can be done all at once using heat and pressure to set the ACA (ZAF, for example). Then the flex cable (20 or 30) and the pads (26 or 26') of the substrate (27 or 27') can be connected in the same way. For example, a temperature of 140 to 180° C. and a pressure of 50 to 110 psi for a time period of 10 to 60 seconds provide an adequate ACA bond. A less desirable method of interconnection is to connect the flex cable to the pads of each chip of the stack (cube) by the ACA (ZAF) under each chip separately. The bonding operation is described in greater detail hereinafter with respect to FIGS. 6A–6C.

It should be noted that a two-metal line or level flex cable, as shown in FIG. 3, can be used for some minor routing of lines, as well as simple bussing, and three or more metal levels or lines allows extensive routing. In the case that connections are made to more than one side of the chip stack or cube, the solder solution doesn't work but the flex cable or flexible plastic tube with one or more metal lines or levels does.

Figure 4:
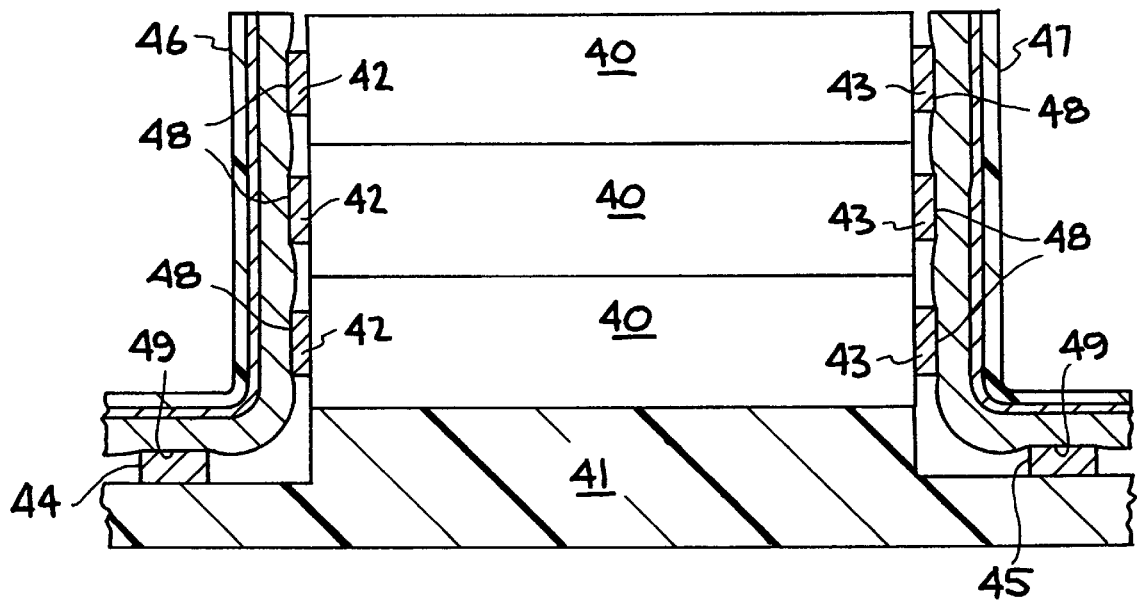
FIG. 4 illustrates another embodiment produced by the method of the present invention involving a stack of chips having side-located pads.

FIG. 4 illustrates chip-to-circuit board interconnection of a cube of stacked chips having rerouted or side-located pads extending to different sides of the chips. As shown, a stack of chips 40 are stacked on a substrate or circuit board 41. The pads 42 and 43, respectively, of each chip 40 are connected to pads 44 and 45 of the circuit board 41 via a pair of curved, flexible plastic tape members or flex cables 46 and 47, each having a metal line or layer and a plastic (insulator) layer, by bonds 48 and 49 to an ACA layer, respectively.

While FIGS. 2–4 illustrate embodiments produced by the attachment method of the present invention, FIG. 5A–5E and FIGS. 6A–6C illustrate an application of the invention for the fabrication of a DRAM cube using a laser patterned 3-D interconnect process, as described in the above-referenced Provisional Application Ser. No. 60/041,262, filed Mar. 19, 1997, and which was based on UCRL-JC-125631, "Fabrication of a DRAM Cube Using a Novel Laser Patterned 3-D Interconnect Process," V. Malba et al., presented at the Sixth International Conference on Multichip Modules, Apr. 2–4, 1997, Denver, Colo. Thus, Provisional Application Ser. No. 60/041,262 and UCRL-JC-125631 are incorporated herein by reference thereto.

The attachment method involving FIGS. 5A–5E and FIGS. 6A–6C involves a 3-D direct write laser lithography process used to reroute pads on DRAM die or chips to new pads on one of the long side-walls of the die. Maskless laser direct writing overcomes the two-dimensional nature of photolithography: a focused laser beam simply forms a point or image in space which can be made to coincide with the surface of the part. Also, laser direct writing permits irradiation of vertical and horizontal die surfaces.

Laser lithography requires a resist which will undergo chemical or physical change under the influence of the laser beam. Conventional resist is not a viable candidate for 3-D patterning, because a conformal, uniform coating cannot be obtained on a complex surface by spinning or spraying. Electrodeposited photoresist (EDPR), which is an aqueous micellar solution of resist with minimal organic solvent and low solids content, can be electrochemically coated onto conductive surfaces with complicated topologies. With a positive EDPR, the laser-exposed areas are developed away, leaving openings in the resist through which copper, nickel, and gold can be plated. After plating, the resist is stripped, and the seed layer is removed. This process is simpler than earlier processes, in that the present process avoids the sidewall polishing and metallization steps, and the pad bumping and TAB attachment, as well as the corresponding wire bonding step.

In place of the conventional solder bump bonding (see FIG. 1), the stacked die (cube) are bonded to single-sided flexible plastic tape or flex cable using ACA, such as described above relative to FIGS. 2–4. A relatively low metal line or layer count or level flex cable can be used because most of the I/O on a DRAM are intended to be bussed with corresponding I/O on other DRAMs. In particular, address, ground, power, and some control lines are bussed on each cube; the data lines and other control lines are not bussed. The stack can be tested on the flex cable before it is connected to the next level of packaging. After test, the flex cable is bonded to a circuit board, such as an FR-4 PCB with the same ACA. The flex cable or flexible plastic tape and ACA easily accommodate mechanical strain, and die/adhesive non-uniformity is unimportant for these pad-to-line connections. Furthermore, edges of the die in a stack do not have to be precisely coplanar because of the flexibility of the flex cable or tape and the method used to land it to the stack, as described hereinafter.

An embodiment of a laser direct write apparatus is illustrated, for example, in FIG. 1 of above-referenced and incorporated document UCRL-JC-125631, and since the details of the apparatus do not constitute part of the present invention, reference is made thereto and the following description is deemed sufficient. The light source of the direct write apparatus, for example, an argon-ion laser operating in the multiline UV range of 338 to 364 nm. The laser can be diverted along either of two beam paths, one normal to the surface, and the other at a 30° angle to the surface. An acousto-optic modulator (AOM) is used in the apparatus to change the laser power, and as a fast electronic shutter. The incident laser power is 6–20 mW, with a beam size of 6 $\mu$m×35 $\mu$m (a cylindrical lens is used to focus the beam to a line, and an aperture is employed which allows the long dimension of the beam to vary from 5 to 65 $\mu$m).

UV microscope objectives are used in the apparatus to focus the laser beam after the cylindrical lens. These objectives are fixed, and a z-axis translation stage is used to focus the beam by moving the sample with respect to the objectives. The apparatus includes a mirror mounted on a computer controlled stepper motor which is moved into the beam path to direct the beam through the angled or normal objectives. A monitoring lamp directed through the normal objective by means of a beam splitter onto both the substrate surface and into a camera allows the operator to both register the die with respect to the substrate and to watch the laser rastering on the surface.

Figure 5A:
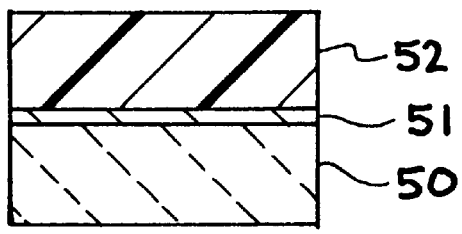
FIGS. 5A–5E illustrate operational steps involved in rerouting the surface pads of an IC chip to form side-located pads on the chip.
Figure 5B:
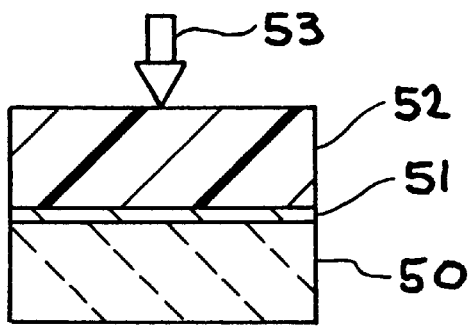
Figure 5C:
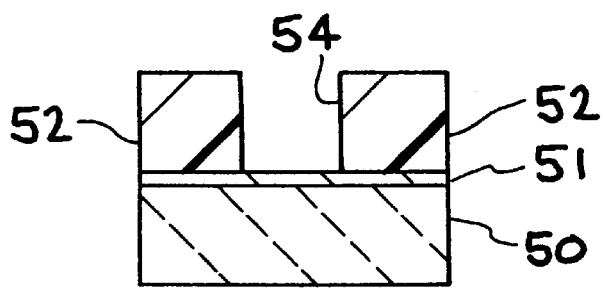
Figure 5D:
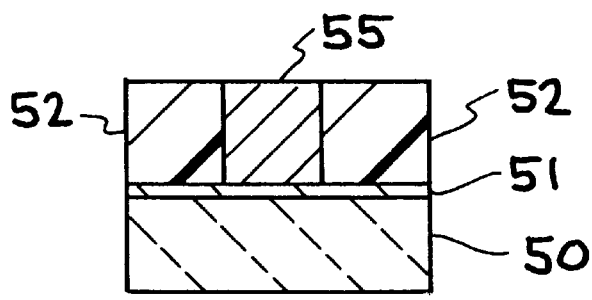

The laser metallization operation using the laser direct write apparatus is now set forth with reference to FIGS. 5A–5E. The individual die are temporarily bonded to a silicon wafer carrier, allowing the die to be processed in a batch for greater efficiency. Following die attachment to the carrier, a conformal dielectric coating is applied in order to passivate the sidewalls of the die, as shown in FIG. 5A, wherein a die or substrate indicated at 50 is coated with the dielectric coating, not shown. Two dielectric processes have been used for this passivation step. One process uses a vapor deposited polyimide coating which is easily ablated from the bond pads before metallization. A second process uses PFCVD silicon oxide. The SiOg process is both reliable and cost effective when applied to die with bond pads in the center of the die, because a shadow masking technique can be used to keep the bond pads clear of SiOg during deposition, eliminating the necessity of another processing step to open the vias. For die with bond pads arrayed along the periphery, the VDP polyimide process is preferred.

Figure 5E:
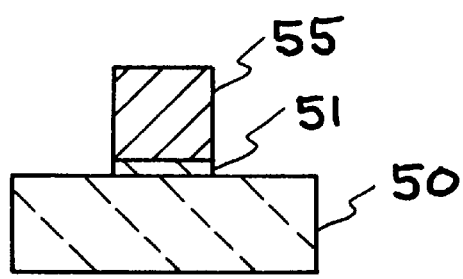

After the die (substrate 50) have been passivated, a metal seed multilayer 51 (see FIG. 5A) is deposited everywhere on the die, and positive EDPR (resist) is electroplated onto the seed layer 51, as shown at 52 in FIG. 5A. The EDPR 52 is then exposed, as indicated at 53 in FIG. 5B, with the computer controlled laser patterning apparatus, and the EDPR (resist) 52 is developed, as indicated by the via 54 in FIG. 5C. Copper (Cu) is then electroplated in the developed areas (via 54) throughout the mask plating, forming the metal interconnects, and nickel (Ni) and gold (Au) are electroplated on top of the copper to form the interconnect, as indicated at 55 in FIG. 5D. The EDPR 52 is stripped to reveal the metal seed layer 51 below, which is then etched away, as shown in FIG. 5E (the seed layer is $\leq 4$ percent of the interconnect 55 thickness, so the thickness of the interconnect lines are not substantially reduced by the seed layer 51 removal). The resultant metal traces 55 are rugged and reliable. They can be produced in thicknesses ranging from $2 \mu m$ to $10 \mu m$, depending on the electrical requirements. An SEM of a metal trace at the edge of a 1 MG DRAM die showed no substantial thinning or defects in the trace having a thickness of 5 $\mu m$ and width of 25 $\mu m$ at the edge of the die.

Using the laser patterning operation, it is relatively simple to reroute contacts on DRAMs or other integrated circuit chips or die from the front face to the sidewalls of the die so that the die can be stacked with other die and connected to the next level of packaging. The above-referenced and incorporated document UCRL-JC-125631 illustrates in FIG. 4 thereof a 16 Mb DRAM with pads near the median of the die which have been rerouted to the edge of the die, using the above-described laser patterning operation, and with the pads formed on the sidewall being 150 $\mu m$ wide with a pitch of 350 $\mu m$. It should be noted that the reroute pattern is not identical for all die in a stack. Address, power, ground, and some control lines are identical, but other control lines and all data lines are not. FIG. 5 of above-referenced UCRL-JC-125631 illustrates a stack of nine 16 Mb DRAMs showing the various side-wall pad configurations required for the memory architecture described in the document, with the top die being simply a silicon substrate for mounting a decoupling capacitor. Thus the laser writing operation easily accommodates the variation in the patterns to be written on the various die since only a change in the CAD file which drives the system is required. Cost benefits accrue from the reduction in the complexity of the next level of packaging.

Following the reroute operation described above, the die are removed from the carrier and stacked using a polyimide film adhesive. Die are aligned with respect to one another using a simple mechanical fixture. The alignment tolerances are not as severe for the flexible plastic tape or flex cable attachment process as they are for solder bump attach. A modest misalignment caused by variations in the thickness of the die and the stacking adhesive could produce a substantial runout error if solar bumps are used. For the flex cable bonding process of the present invention, there is no requirement for equal spacing between the die because pads are bonded to lines, not to individual pads. The orthogonal alignment tolerances are also fairly modest because the size and pitch of the sidewall pads are much larger than are needed for the ACA (bonding) to be effective. Pads with pitch $\geq 0.004$ inches can be successfully bonded.

Figure 6A:
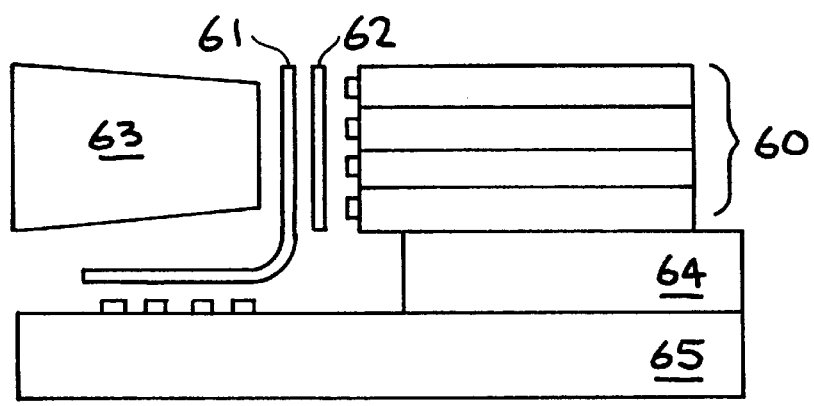
FIGS. 6A, 6B, and 6C illustrate assembly steps in accordance with the present invention for attaching a stack of IC chips having side-located pads to a circuit board.
Figure 6B:
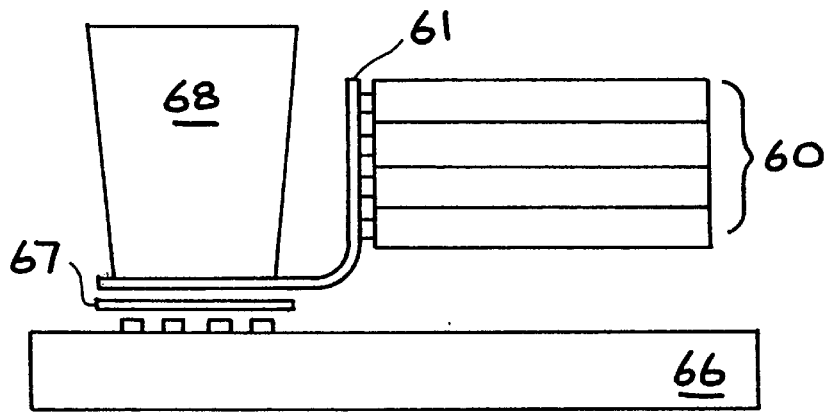
Figure 6C:
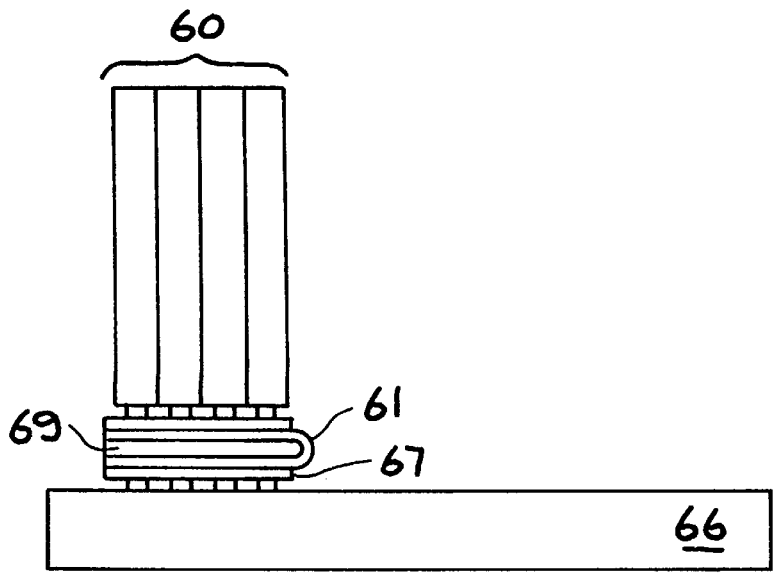

Referring now to FIGS. 6A–6C, the pads on the stacks are bonded to the flex cable or tape in a single-step process. This single-step process is schematically illustrated in FIG. 6A, although the preferred single step uses a diaphragm bond. As illustrated in FIG. 6A, the pads of the stack of die or chips 60 are bonded to a flexible plastic tape 61 of the type illustrated in FIGS. 2 and 3 via a layer 62 of ACA by a bonder 63, the die or chips 60 are supported on a removable member 64 located on a support 65. Using the preferred diaphragm bonder, approximately 60 psi pressure is applied to the tape/ACA/stack through a thin aluminum diaphragm which seals one side of a nitrogen pressurized chamber. The entire assembly is heated to 140° C. for a 30-second duration of the bonding. The diaphragm bonder is preferred for stack-to-tape connection because the conformality of the nitrogen pressurized diaphragm provides equal force to the face of each die, assuring good contact to each die even if some are slightly misaligned.

In the final assembly, as shown in FIG. 6B and 6C, the flexible tape 61 is bonded to a circuit board 66 via a layer 67 of ACA using a hot-bar thermode bonder 68. The circuit board 66 is heated to 60° C. and the thermode is held at 150° C. A pressure of 100 psi is applied for 30 seconds. After tape-to-board bonding, as shown in FIG. 6B, the flex tape 61 is folded over and bonded to itself with an adhesive 69, such as Hardman D-85, as shown in FIG. 6C. The footprint of the stack plus the flex tape is little more than the footprint of the stack itself.

It has thus been shown that the present invention provides a new method for packaging integrated circuits in three dimensions. The method may, for example, utilize a laser direct writing scheme to reroute I/O pads on DRAM chips to new pads on one of the long sides of the die, or it may be utilized to bond die to circuit boards wherein the pad reroute has been carried out by other techniques. The principle bonding feature of the present invention is in the use of a flex cable or tape having a metal layer thereon which is bonded to the pads of the die and/or circuit board using ACA. This bonding approach enables bonding a number of pads on a stack of die or chips in a single operation, with the bonded pads being connectable to a single pad on the circuit board, thus simplifying fabrication.

While the invention is particularly applicable in the bonding of a stack of DRAM chips or die, it can be used in the fabrication of a solid-state memory or in high-density memory systems, such as supercomputers and hand-held electronics, such as personal digital assistants and cellular phones.

While particular embodiments, materials, temperatures, time periods, etc., have been described or illustrated to exemplify and explain the principles of the invention, such are not intended to be limiting. Modifications and changes may become apparent to those skilled in the art, and it is intended that the invention be limited only by the scope of the appended claims.

The invention claimed is:

1. A method for interconnecting a plurality of pads of integrated circuit chips to a single pad of a circuit board, comprising:

aligning a plurality of integrated circuit chips such that pads thereon are aligned, providing a flexible tape having at least one metal line thereon, bonding the flexible tape to the aligned pads of the chips using an anisotropically conducting adhesive, and bonding the flexible tape to the single pad of the circuit board using an anisotropically conducting adhesive.

2. The method of claim 1, additionally including rerouting the pads of the chips to form pads on the sidewalls of the chips prior to aligning the chips.

3. The method of claim 1, wherein the bonding is carried out at a temperature of less than about 150° C.

4. The method of claim 1, wherein the bonding is carried out at a pressure of 50 to 110 psi for a time period of 10 to 60 seconds.

5. The method of claim 1, additionally including providing the flexible tape with a plurality of electrically interconnected metal lines thereon.

6. The method of claim 5, wherein the bonding of the flexible tape to the chip pads is carried out using at least one of the plurality of metal lines, and wherein the bonding of the flexible tape to the pad of the circuit boards is carried out using another of the plurality of metal lines.

7. The method of claim 1, wherein the bonding is carried out using a plurality of flexible tapes for bonding of different pads on the chips to additional pads on the circuit board.

8. The method of claim 2, wherein rerouting the pads of the chips is carried out using direct write laser lithography.

9. The method of claim 8, wherein the direct write laser lithography is carried out by:

passivation of at least the sidewalls of the chip, forming a seed layer on the chip, depositing a resist on the seed layer, developing areas of the resist using laser energy, depositing at least one metal layer on the developed areas of the resist to form metal interconnects and side-located pads, stripping the remaining resist, and removing the exposed seed layer.

10. The method of claim 9, wherein passivation of at least the sidewalls of the chip is carried out by a process selected from the group consisting of a vapor deposited polyimide coating and a PECVD silicon oxide coating.

11. The method of claim 9, wherein the seed layer is of a multilayer type.

12. The method of claim 9, wherein depositing a resist is carried out by electroplating positive EDPR on the seed layer.

13. The method of claim 9, wherein developing areas of the resists is carried out by exposing the resist with a computer controlled laser patterning apparatus.

14. The method of claim 13, wherein the laser patterning is carried out using an argon-ion laser operating in the multiline UV range from 338 to 364 nm.

15. The method of claim 9, wherein depositing of the at least one metal layer is carried out by depositing a layer of copper, a layer of nickel, and a layer of gold.

16. The method of claim 1, wherein bonding the flexible tap to the aligned pads of the chips is carried by simultaneous bonding to each aligned pad.

17. A method for fabrication of a DRAM cube, comprising:

rerouting pads on the DRAM die to a sidewall thereof, aligning the die to align selected rerouted pads, bonding the aligned pads to a flexible tape using an anisotropically conducting adhesive, and bonding the flexible tape to a pad on a circuit board.

18. The method of claim 17, wherein rerouting pads on the DRAM die is carried out using direct write laser lithography.

19. The method of claim 17, wherein bonding the aligned pads to the flexible tape is carried out using a diaphragm bonder.

20. The method of claim 17, wherein bonding the flexible tape to the circuit board is carried out using a hot-bar thermode bonder.

21. The method of claim 17, additionally including folding the section of the flexible tape bonded to the aligned DRAM die pads over the section of the flexible tape to the circuit board.

22. The method of claim 17, wherein bonding each of the aligned pads is carried out simultaneously.

* * * * *